United States Patent
Nam et al.

(10) Patent No.: US 7,851,364 B2
(45) Date of Patent: Dec. 14, 2010

(54) METHOD FOR FORMING PATTERN IN SEMICONDUCTOR DEVICE

(75) Inventors: Ki-Won Nam, Ichon-shi (KR); Tae-Han Kim, Ichon-shi (KR)

(73) Assignee: Hynix Semiconductor Inc., Icheon-si (KR)

( * ) Notice: Subject to any disclaimer, the term of this patent is extended or adjusted under 35 U.S.C. 154(b) by 852 days.

(21) Appl. No.: 11/739,647

(22) Filed: Apr. 24, 2007

(65) Prior Publication Data

US 2008/0108222 A1  May 8, 2008

(30) Foreign Application Priority Data

Nov. 2, 2006  (KR) .................... 10-2006-0107705

(51) Int. Cl.
*H01L 21/311* (2006.01)
(52) U.S. Cl. .................. 438/694; 438/299; 438/618; 438/672; 438/736; 257/E21.645
(58) Field of Classification Search .......... 438/694, 438/299, 618, 672, 736, 763; 257/E21.645
See application file for complete search history.

(56) References Cited

U.S. PATENT DOCUMENTS

| 5,521,121 | A | * | 5/1996 | Tsai et al. | .................. 438/627 |
| 6,645,797 | B1 | * | 11/2003 | Buynoski et al. | ............ 438/157 |
| 7,037,850 | B2 | * | 5/2006 | Lee et al. | .................... 438/725 |
| 2007/0077715 | A1 | * | 4/2007 | Kang et al. | ................. 438/299 |

FOREIGN PATENT DOCUMENTS

| JP | 10-173200 | 6/1998 |
| JP | 2000-058827 | 2/2000 |
| KR | 1019990025043 A | 4/1999 |
| KR | 1019990057408 A | 7/1999 |
| KR | 1020030049245 A | 6/2003 |
| KR | 1020050058916 A | 6/2005 |
| KR | 1020050063309 A | 6/2005 |
| KR | 1020060007674 A | 1/2006 |

* cited by examiner

*Primary Examiner*—Lan Vinh
*Assistant Examiner*—Maki A Angadi
(74) *Attorney, Agent, or Firm*—Townsend and Townsend and Crew LLP

(57) ABSTRACT

A method for forming a pattern in a semiconductor device includes forming an etch target layer comprising metal over a substrate. A hard mask pattern is formed over the etch target layer. The etch target layer is etched to form a pattern such that a line width of the etch target layer is smaller than a line width of the hard mask pattern.

19 Claims, 3 Drawing Sheets

METHOD FOR FORMING PATTERN IN SEMICONDUCTOR DEVICE

CROSS-REFERENCE TO RELATED APPLICATIONS

The present invention claims priority to Korean patent application number 10-2006-0107705, filed on Nov. 2, 2006, which is incorporated by reference in its entirety.

BACKGROUND OF THE INVENTION

The present invention relates to a method for fabricating a semiconductor device, and more particularly, to a method for forming a pattern in a semiconductor device.

In a conventional method for forming a pattern in a semiconductor device, a bit line hard mask is patterned and then a bottom metal electrode and a polysilicon layer are etched using the bit line hard mask as an etch mask to form bit line patterns. However, upper portions of the bit line patterns are often damaged while etching the bottom layers using the bit line hard mask as an etch mask. Thus, a mask pattern formed for patterning the bit line hard mask is not removed and is used as an etch mask for etching the bottom layers such that the upper portions of the bit line patterns are not damaged.

FIGS. 1A and 1B illustrate cross-sectional views of a conventional method for forming a pattern in a semiconductor device.

Referring to FIG. 1A, an insulation layer 12 is formed over a substrate 11. A barrier metal layer 13 and a metal electrode layer 14 are sequentially formed over the insulation layer 12. A hard mask layer is formed over the metal electrode layer 14. The hard mask layer is patterned to form bit line hard masks 15. The bit line hard masks 15 may be formed after forming a mask pattern 16 over the hard mask layer. The mask pattern 16 may include a stack structure including an amorphous carbon layer, an anti-reflective coating layer, and a photoresist pattern. The anti-reflective coating layer may include silicon oxynitride (SiON).

Referring to FIG. 1B, the metal electrode layer 14 and the barrier metal layer 13 are etched to form bit line patterns using the mask pattern 16 as an etch barrier. Thus, the bit line patterns each include a barrier metal 13A, a metal electrode 14A, and the bit line hard mask 15.

In the aforementioned conventional method, the mask pattern 16 is not removed after forming the bit line hard masks 15. The mask pattern 16 is used to pattern the metal electrode layer 14 and the barrier metal layer 13 in order to reduce damage to upper portions of the bit line patterns.

However, polymers 17 (FIG. 1A) may form on sidewalls of the mask pattern 16 and the bit line hard masks 15 while forming the bit line hard masks 15, thereby generating a sloped profile. When the etching of the bottom layers is performed, the polymers 17 function as an etch mask, resulting in a width $W_{12}$ of the bit line patterns which is larger than a width $W_{11}$ of the bit line hard masks 15.

As the width $W_{12}$ of the bit line patterns increases, a failure of a self-aligned contact (SAC) may occur when forming subsequent storage node contact holes due to a decreased margin of space between the bit line patterns.

SUMMARY OF THE INVENTION

Embodiments of the present invention provide a method for forming a pattern in a semiconductor device, which can reduce an instance of failure of a self-aligned contact (SAC) generated by a decreased margin of space between the bit line patterns when forming subsequent contact holes. The decreased margin is caused by polymers generated during a hard mask patterning that enlarge a width of a pattern.

Other embodiments of the present invention provide a method for forming a pattern in a dynamic random access memory (DRAM) device of a semiconductor device.

In accordance with an aspect of the present invention, a method for forming a pattern in a semiconductor device is provided. An etch target layer comprising metal is formed over a substrate. A hard mask pattern is formed over the etch target layer. The etch target layer is etched to form a pattern such that a line width of the etch target layer is smaller than a line width of the hard mask pattern.

In accordance with another aspect of the present invention, a method for forming a pattern in a semiconductor device is provided. An etch target layer is formed over a substrate. A hard mask pattern is formed over the etch target layer. The etch target layer is laterally etched using a high temperature etching process such that polymers formed on sidewalls of the hard mask pattern are removed, wherein a line width of the etch target layer is smaller than a line width of the hard mask pattern.

DESCRIPTION OF SPECIFIC EMBODIMENTS

The present invention relates to a method for forming a pattern in a semiconductor device. According to an embodiment of the present invention, a self-aligned contact (SAC) margin may be increased when forming a subsequent contact hole by forming a pattern having a vertical profile.

Furthermore, a metal electrode and a barrier metal are etched using a high temperature etching process such that the metal electrode and the barrier metal obtain a vertical profile. Thus, damage to an upper portion of a pattern may be prevented and a stable shape may be obtained.

FIGS. 2A to 2D illustrate cross-sectional views of a method for forming a pattern in a semiconductor device in accordance with an embodiment of the present invention.

Figure 1A:
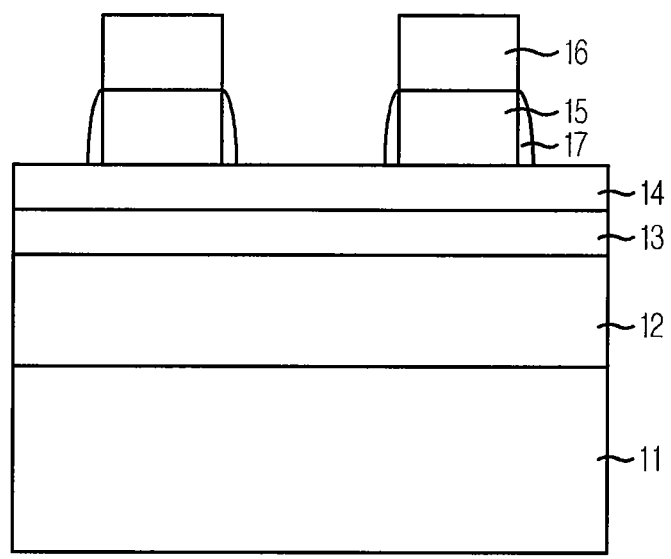
FIGS. 1A and 1B illustrate cross-sectional views of a conventional method for forming a pattern in a semiconductor device.
Figure 1B:
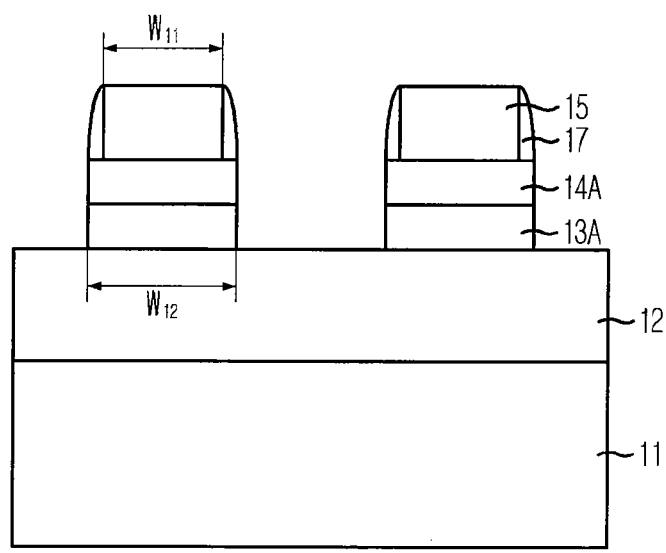
Figure 2A:
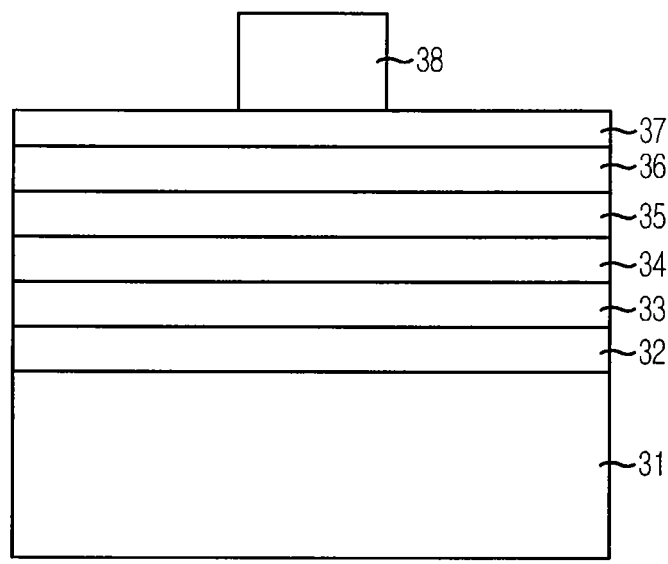
FIGS. 2A to 2D illustrate cross-sectional views of a method for forming a pattern in a semiconductor device in accordance with an embodiment of the present invention.

Referring to FIG. 2A, an insulation layer 32 is formed over a substrate 31. The insulation layer 32 may include an oxide-based layer in a single-layer or a multiple-layer structure. Although not shown, gate patterns and landing plug contacts may be formed prior to forming the insulation layer 32.

A barrier metal layer 33, a metal electrode layer 34, and a bit line hard mask layer 35 are formed over the insulation layer 32. The barrier metal layer 33 may include a stack structure configured with titanium (Ti)/titanium nitride (TiN). The metal electrode layer 34 may include tungsten (W), and the bit line hard mask layer 35 may include a nitride-based layer.

An amorphous carbon layer 36 and a silicon oxynitride (SiON) layer 37 are formed over the bit line hard mask layer 35. The amorphous carbon layer 36 and the SiON layer 37 are formed to secure a margin of a photoresist pattern when patterning gates. The SiON layer 37 also functions as an anti-reflective coating layer when forming the photoresist pattern.

A photoresist pattern 38 is formed over the SiON layer 37. The photoresist pattern 38 is formed by coating a photoresist layer over the SiON layer 37 and then performing a photo-exposure and developing process to pattern the photoresist layer, thereby defining a gate pattern region.

Figure 2B:
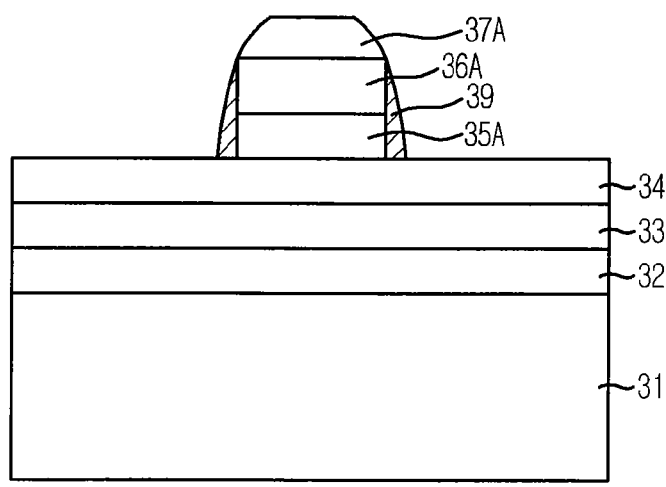

Referring to FIG. 2B, the SiON layer 37 and the amorphous carbon layer 36 are etched using the photoresist pattern 38 as an etch barrier to form a SiON pattern 37A and an amorphous carbon pattern 36A. Polymers may be generated while etching the SiON layer 37 and the amorphous carbon layer 36.

The photoresist pattern 38 may be removed after the amorphous carbon pattern 36A is formed. If portions of the photoresist pattern 38 remain, a dry etching process, such as an oxygen removal, may be performed to remove the remaining portions of the photoresist pattern 38.

The bit line hard mask layer 35 is etched to form a bit line hard mask pattern 35A. A large amount of polymers are generated while forming the bit line hard mask pattern 35A. Hereinafter, the polymers generated while forming the SiON pattern 37A, the amorphous carbon pattern 36A, and the bit line hard mask pattern 35A are referred to as polymers 39.

The polymers 39 accumulated on sidewalls of the amorphous carbon pattern 36A and the bit line hard mask pattern 35A form a sloped profile. When a subsequent etching process is performed, a width of a bit line pattern may be increased by as much as a width of the polymers 39.

Figure 2C:
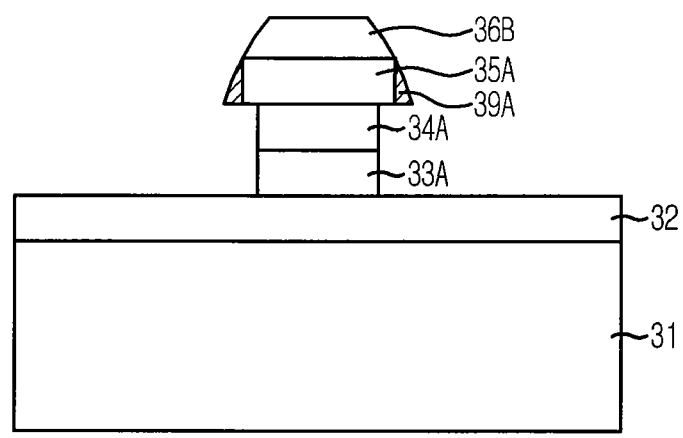

Referring to FIG. 2C, the metal electrode layer 34 and the barrier metal layer 33 are etched to form a pattern such that widths of a resultant metal electrode pattern 34A and a barrier metal pattern 33A are smaller than a width of the bit line hard mask pattern 35A. The metal electrode layer 34 and the barrier metal layer 33 are etched using a high temperature etching process.

Performing the high temperature etching process includes increasing a temperature of a wafer located in an etch chamber from room temperature to a significantly higher temperature. Contrary to the etching process performed at room temperature as described in FIGS. 2A and 2B, the metal electrode layer 34 and the barrier metal layer 33 are etched at a high temperature ranging from approximately 50° C. to approximately 300° C. to obtain a sidewall etch characteristic.

The high temperature etching process includes separately etching the metal electrode layer 34 and the barrier metal layer 33. Etching the metal electrode layer 34 includes using a gas for etching tungsten (W). For instance, the gas may include a mixed gas of sulfur hexafluoride ($SF_6$), nitrogen trifluoride ($NF_3$), and argon (Ar). Etching the barrier metal layer 33 includes using a gas for etching Ti/TiN. For instance, the gas may include chlorine ($Cl_2$) gas or trichloroborane ($BCl_2$) gas.

Performing the aforementioned high temperature etching process at a temperature ranging from approximately 50° C. to approximately 300° C. results in lateral etching of the metal electrode layer 34 and the barrier metal layer 33. Thus, the metal electrode pattern 34A and the barrier metal pattern 33A are formed with a vertical profile having a smaller line width than the line width of the bit line hard mask pattern 35A including the polymers 39. Therefore, the sloped profile caused by the polymers 39 is removed. Reference denotation 39A refers to any residual polymers.

Although the SiON pattern 37A is removed during the lateral etching of the metal electrode layer 34 and the barrier metal layer 33, a portion of the amorphous carbon pattern 36A (i.e., a residual amorphous carbon pattern 36B) remains over the bit line hard mask pattern 35A. The residual amorphous carbon pattern 36B prevents damage to an upper portion of the bit line hard mask pattern 35A.

Figure 2D:
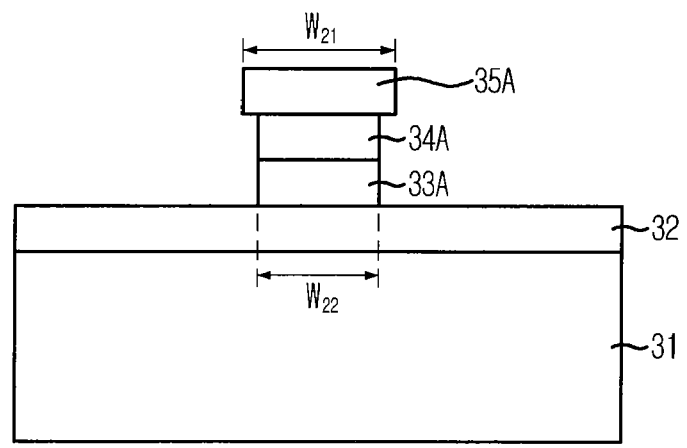

Referring to FIG. 2D, the residual amorphous carbon pattern 36B and the residual polymers 39A are removed. The residual amorphous carbon pattern 36B and the residual polymers 39A may be removed using oxygen gas.

Accordingly, a bit line pattern is formed having a vertical profile with a width $W_{22}$ that is smaller than a width $W_{21}$ of the bit line hard mask pattern 35A. The bit line pattern includes a stack structure configured with the barrier metal pattern 33A, the metal electrode pattern 34A, and the bit line hard mask pattern 35A. The line widths of the barrier metal pattern 33A and the metal electrode pattern 34A are smaller than the line width of the bit line hard mask pattern 35A.

A subsequent process is performed to form another insulation layer over the bit line pattern, and to form storage node contact holes between bit line patterns. The bit line patterns each have a vertical profile that defines sufficient space between the bit line patterns. Thus, an open margin of the storage node contact holes may be secured, and consequently, a SAC margin may be increased.

According to the embodiment of the present invention, the bit line patterns are each formed to have a vertical profile to define sufficient space between the bit line patterns. Thus, the SAC margin may be increased during a subsequent storage node contact hole formation.

Furthermore, the metal electrode pattern and the barrier metal pattern are laterally etched using a high temperature etching process to obtain a vertical profile of the bit line pattern. Thus, damage to the upper portion of the bit line pattern may be prevented and a stable shape may be obtained.

This embodiment of the present invention describes an application in a dynamic random access memory (DRAM) having bit lines and storage nodes. However, the technological concept of this invention may also be applied to forming patterns in other types of semiconductor devices other than a DRAM.

While the present invention has been described with respect to a specific embodiment, it will be apparent to those skilled in the art that various changes and modifications may be made without departing from the spirit and scope of the invention as defined in the following claims.

What is claimed is:

1. A method for forming a pattern in a semiconductor device, the method comprising:
    forming an etch target layer comprising metal over a substrate;
    forming a hard mask pattern over the etch target layer; and
    etching the etch target layer to form an etch target layer pattern such that a line width of the etch target layer pattern is smaller than a line width of the hard mask pattern that remains after the etch target layer pattern is formed.

2. The method of claim 1, wherein etching the etch target layer comprises performing a high temperature etching process.

3. The method of claim 2, wherein the high temperature etching process comprises using a wafer in an etch chamber at a temperature ranging from approximately 50° C. to approximately 300° C.

4. The method of claim 2, wherein the etch target layer comprises a stack structure including a barrier metal and a metal electrode layer.

5. The method of claim 4, wherein the barrier metal comprises a stack structure including a titanium (Ti)/titanium nitride (TiN) layer, and the metal electrode layer comprises a tungsten (W) layer.

6. The method of claim 4, wherein the high temperature etching process comprises separately etching the metal electrode layer and the barrier metal.

7. The method of claim 6, wherein etching the metal electrode layer comprises using a mixed gas including sulfur hexafluoride ($SF_6$), nitrogen trifluoride ($NF_3$), and argon (Ar).

8. The method of claim 6, wherein etching the barrier metal comprises using one of: chlorine ($Cl_2$) gas and trichloroborane ($BCl_2$) gas.

9. The method of claim 1, wherein the etch target layer pattern comprises one of: a bit line pattern and a gate pattern.

10. The method of claim 1, wherein forming the hard mask pattern comprises:
   forming a nitride-based layer, an amorphous carbon layer, and anti-reflective coating layer over the etch target layer;
   forming a photoresist layer over the anti-reflective coating layer;
   etching the anti-reflective coating layer, the amorphous carbon layer, and the nitride-based layer using a photoresist pattern formed from the photoresist layer as an etch barrier; and
   removing the photoresist pattern.

11. A method for forming a pattern in a semiconductor device, the method comprising:
   forming an etch target layer over a substrate;
   forming a hard mask pattern over the etch target layer; and
   laterally etching the etch target layer to form an etch target layer pattern using a high temperature etching process such that polymers formed on sidewalls of the hard mask pattern are removed, wherein a line width of the etch target layer pattern is smaller than a line width of the hard mask pattern that remains after the etch target layer pattern is formed.

12. The method of claim 11, wherein the high temperature etching process is performed at a temperature ranging from approximately 50° C. to approximately 300° C.

13. The method of claim 11, wherein the etch target layer comprises a stack structure including a barrier metal and a metal electrode layer.

14. The method of claim 13, wherein the barrier metal comprises a stack structure including a titanium (Ti)/titanium nitride (TiN) layer, and the metal electrode layer comprises a tungsten (W) layer.

15. The method of claim 13, wherein the high temperature etching process comprises separately etching the metal electrode layer and the barrier metal.

16. The method of claim 15, wherein etching the metal electrode layer comprises using a mixed gas including sulfur hexafluoride ($SF_6$), nitrogen trifluoride ($NF_3$), and argon (Ar).

17. The method of claim 15, wherein etching the barrier metal comprises using one of: chlorine ($Cl_2$) gas and trichloroborane ($BCl_2$) gas.

18. The method of claim 11, wherein the etch target layer pattern comprises one of: a bit line pattern and a gate pattern.

19. The method of claim 11, wherein forming the hard mask pattern comprises:
   forming a nitride-based layer, an amorphous carbon layer, and anti-reflective coating layer over the etch target layer;
   forming a photoresist layer over the anti-reflective coating layer;
   etching the anti-reflective coating layer, the amorphous carbon layer, and the nitride-based layer using a photoresist pattern formed from the photoresist layer as an etch barrier; and
   removing the photoresist pattern.

* * * * *